United States Patent [19]
Dennard et al.

[11] Patent Number: 5,811,993
[45] Date of Patent: Sep. 22, 1998

[54] SUPPLY VOLTAGE INDEPENDENT BANDGAP BASED REFERENCE GENERATOR CIRCUIT FOR SOI/BULK CMOS TECHNOLOGIES

[75] Inventors: Robert Heath Dennard, New Rochelle; Thekkemadathil Velayudhan Rajeevakumar, Scarsdale, both of N.Y.

[73] Assignee: International Business Machines Corporation, Armonk, N.Y.

[21] Appl. No.: 725,784

[22] Filed: Oct. 4, 1996

[51] Int. Cl.[6] .................................................. G01R 19/00
[52] U.S. Cl. ........................... 327/54; 327/73; 327/538; 327/539; 327/541; 327/543
[58] Field of Search .................................. 327/54, 73, 87, 327/530, 538, 539, 540, 541, 542, 543; 323/313, 314

[56] References Cited

U.S. PATENT DOCUMENTS

| | | | |
|---|---|---|---|
| 5,162,668 | 11/1992 | Chen et al. ............................ | 307/296.8 |
| 5,184,033 | 2/1993 | Chiao et al. ............................ | 307/446 |
| 5,594,373 | 1/1997 | McClure .................................. | 327/108 |

*Primary Examiner*—Timothy P. Callahan
*Assistant Examiner*—Jung Ho Kim
*Attorney, Agent, or Firm*—Whitham, Curtis & Whitham; Robert P. Tassinari

[57] ABSTRACT

A FET band-gap reference generating circuit having a two-branch differential amplifier with a saturation state FETs for equal branch current, independent of power supply voltage, with a feedback connection to a reference FET in one branch, for driving the steady state output to the threshold voltage of the reference FET, also independent of the power supply voltage. A multistage circuit connects a divided down output of a first FET band-gap reference generating circuit to a current bias terminal of similar second FET based differential amplifier so that the steady state output of the second amplifier is equal to the sum of the divided down output and a threshold voltage of a second reference FET in the second amplifier.

13 Claims, 3 Drawing Sheets

SUPPLY VOLTAGE INDEPENDENT BANDGAP BASED REFERENCE GENERATOR CIRCUIT FOR SOI/BULK CMOS TECHNOLOGIES

DESCRIPTION

1. Field of the Invention

The present invention relates to reference voltage circuits within integrated circuit chips and, more particularly, to a band gap reference circuit formed of field-effect (FET) transistors for implementation in silicon-on-insulator (SOI) and bulk technologies.

2. Description of the Related Art

Because of an increasing use of battery-powered portable communication and computation equipment there is a movement in the integrated circuit (IC) industry toward low power devices. Chip performance requirements, however, are continuing to increase because of higher computation and data transfer rates. The power dissipation of an IC can be reduced, while having equal or better performance, by using shorter device lengths in scaled CMOS technologies, and by using a lower power-supply voltage. The lower power supply voltage, however, may be incompatible with existing system supply standards such as, for example, the commonly used 3.3 V. The incompatibility can be eliminated by including an on-chip regulator, or a dc-to-dc converter that generates a lower voltage for the chip's internal circuits. These on-chip regulators or dc-to-dc converters, however, must be connected to a precise reference-voltage generator to operate. Accordingly, the increasing use of a lower on-chip power supply voltage is increasing the need for precise reference voltage generating circuits on the chip. In addition, there are analog circuit applications that could benefit from low-power and stable reference generators.

One generally used reference voltage circuit is a bandgap based generating circuit comprising low-gain bipolar transistors. In CMOS technology, these circuits are fabricated using vertical well-based bipolar transistors. However, bipolar transistors dissipate comparatively more power than field-effect, e.g., CMOS, transistors and, therefore, may be unsuitable for low power applications. In addition, vertical bipolar transistors are not available in SOI technology.

SUMMARY OF THE INVENTION

The objective of the present invention is to provide an on-chip low power stable reference voltage generator suitable for low power applications, which can be implemented in bulk and SOI technologies.

More particulary, a first embodiment of the present invention includes a differential amplifier having a first branch, a second branch and a common current branch, and a load branch. The first and second branches of the differential amplifier extend in parallel from a power supply terminal to a first terminal of the common current branch. The common current branch includes a bias current element which sets a bias current through the common current branch in accordance with a first bias voltage received at the element's control terminal.

Each of the first and second branches includes respective first and second current control elements. The first current control elements of each of the first and second branches are connected to provide equal current through the branches.

The second current control element of the first branch passes a first branch predetermined current when the voltage on its control terminal is at a predetermined first branch bias level.

The second current control element of the second branch passes approximately the first branch predetermined current when the voltage on its control terminal is above a first threshold.

The load branch includes a load current control element in series with a load element. The load current control element controls a current through the load element in accordance with a voltage on its control terminal. A reference output terminal on the load element has a voltage proportional to the current through that element, and feeds back to the second controlled current element of the second branch. Over a predetermined range of current, the second controlled current element of the second branch generates a voltage that is approximately proportional to the current passing through said element. The generated voltage connects to the load current control element's control terminal. The circuit of this embodiment will have a steady state current which is equal and constant through the first and second branches, each being equal to one half the bias current through the common bias branch, upon receiving the first predetermined bias voltage at the second controlled current element of the first branch, and the second predetermined bias voltage at the common bias current control element, and the power supply voltage, regardless of variations in that supply voltage. Stated another way, the voltage to the control terminal of the second controlled current element of the second branch, which is the reference output voltage, is driven to the second predetermined threshold voltage, via the feedback connection from the load element, which has a voltage determined, indirectly, by the current through the second branch regardless of variations in that supply voltage.

In one alternative embodiment of the above circuit, the second controlled current element of the first branch has a first branch bias voltage of approximately zero, and when connected to ground, conducts a current approximately equal to the current that the second controlled current element of the second branch conducts at its first predetermined threshold voltage.

In another alternative embodiment, the bias current element of the common current branch conducts a predetermined bias current when the voltage received at its control terminal is equal to zero.

Still another embodiment of the present invention includes a first and second generator circuit, each substantially identical to the generator circuit of the earlier embodiments. In this embodiment a voltage divider element on the reference voltage output of the first generator circuit outputs an intermediate voltage which is approximately 1/D times the first threshold voltage. The intermediate voltage output connects to the control terminal of the second controlled current element of the first branch of the second generator circuit, which conducts a predetermined branch current when it receives the voltage of 1/D times the second threshold voltage. The second controlled current element of the second branch of the second generator circuit conducts a current equal to the predetermined branch current of the first branch when it receives a second threshold voltage from its feed connection from the second circuit's load element.

A circuit according to the embodiment above generates, at steady state, over a predetermined range of power supply voltages, a voltage at the control terminal of the second controlled current element of the second branch of the second generator circuit equal to the sum of 1/D times the first threshold voltage and said second threshold voltage.

A still further embodiment of the present invention includes fused-linked conducting elements in parallel with the bias current element for trimming the bias current.

BRIEF DESCRIPTION OF THE DRAWINGS

The foregoing and other objects, aspects, and advantages will be better understood from the following description of preferred embodiments of the invention with reference to the drawings, in which.

DETAILED DESCRIPTION OF THE EMBODIMENTS

Figure 1:
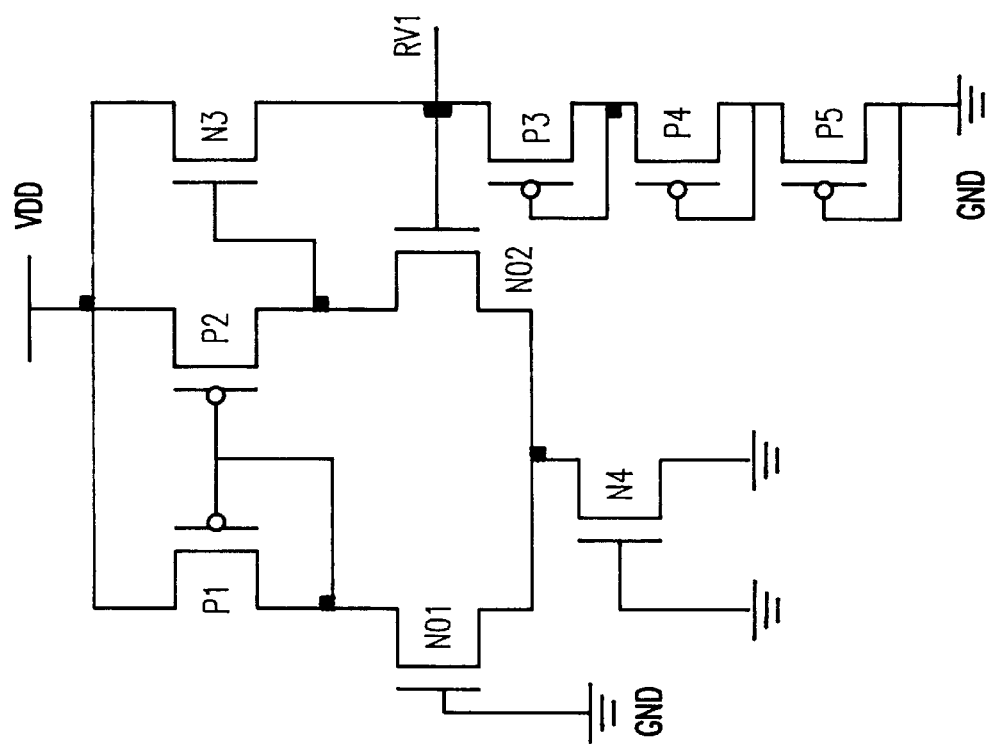
FIG. 1 is a schematic diagram of a band gap reference circuit according to a first embodiment of the invention.

Referring to FIG. 1 the structure and operation of a reference generator according a first embodiment of the present invention will be described. It will be understood that the present invention relates to CMOS technology and that the circuitry described herein will operate if fabricated according to known CMOS design methods. In addition, specific examples of the embodiments described herein were simulated, using known simulation software, based on 0.25 and 0.15 micron CMOS technology, and the results are described herein. However, as will be understood by one skilled in the art, the present invention is applicable to other CMOS technologies as well.

Referring again to FIG. 1, the basic circuit of this embodiment comprises a differential amplifier (not numbered) formed of transistors P1, P2, N01, and N02 and N4. For this embodiment, transistors N01 and N4 are NFET devices, fabricated with n+ gate poly, to have approximately zero threshold voltage by blocking the p-well and threshold adjust implants. Transistor N02 is formed identical to N01 except that N02 employs a P+ gate poly, rather than n+ gate poly, to have a threshold voltage, for this example, of approximately 1.1V higher than that of N01.

The unconventional device N02 is easily implemented using standard CMOS technology. For example, after the well-implant, a buried resistor diffusion implant level is used to generate the n+ source/drain diffusion for these devices. The polysilicon gate conductor level is made wide enough to overlap these source/drain regions, even after large alignment tolerances are taken into consideration. The gate p+ source/drain implant level is designed to be smaller than the polysilicon gate conductor level. The complement of the P-well implant level is used to block the threshold tailor n-channel implant. The measured threshold voltage of a zero threshold device with n+ poly is about zero volts in 0.25 micron CMOS runs. The same device with p+ poly is about 1.1 V. These results are independent of device length, in the range of device geometries relevant to this invention.

Referring again to FIG. 1, the output RV1 of the differential amplifier, which is the connection between the drain (not numbered) of P2 and the drain (not numbered) of N02, drives the NFET device N3. The source (not numbered) of N3 connects to the gate (not numbered) of N02, which is the reference voltage output RV.

The N3 transistor is a conventional NFET with a threshold voltage of approximately 0.6V. PFETs P3,P4 and P5, which have a threshold voltage of 0V to 0.6V, constitute the load from RV to ground, thereby providing a path for the current through N3. The set of three PFETs P3, P4 and P5 is an example load, selected to divide the voltage drop among three elements. Alternatively, one, two or more than three FETs could be used. Another alternative is to use resistors (not shown).

The circuit of FIG. 1 operates as follows: Devices N01 and N4 are turned on, even though the gate is grounded, because N01 and N4 have zero threshold voltage, and the drain of each (not numbered) is at a voltage higher than the respective source.

The gates (not numbered) of conventional PFET devices P1 and P2 are connected and, therefore, the steady-state current through the devices is substantially equal. Accordingly, the gate voltage on transistor N02, which is a function of the current through N3, which in turn is a function of the current through (and voltage drop across) P2 and N02, is forced in a feedback manner to its threshold voltage of 1.1V. The result is that, at steady state, the current through the two branches, i.e., P1, N01 and P2, N02, of the differential amplifier becomes nearly equal and, in a related fashion, the reference output RV is forced to the N02 threshold voltage of 1.1V. Note that P1 and P2 are in saturation provided that VDD is greater than a readily calculable minimum, which is based on the particular threshold voltages of P1 and P2 and the voltage drop across N01, N02 and N4. These voltage drops are readily determined by the devices' parameters and are approximately proportional to the bias current through each. Therefore, the bias current through N4 should be low, which is further provided for by the N4' device and its bias voltage in the alternative embodiment described below.

The above-described FIG. 1 embodiment yields an output reference voltage RV of 1.1 V independent of any supply voltage VDD because, as stated above, P1 and P2 are in saturation. Therefore, variations in VDD do not affect the current through the two branches, P1, N01 and P2, N02. Instead, the current through each of the branches will remain approximately one-half the zero gate voltage current through N4 and, accordingly, the reference voltage RV will remain at the N02 threshold voltage of 1.1V.

The load current through P3, P4, and P5 is small, in the range of a few micro amps, or less. The current through N4 at zero gate volts is also small—in the range of a few micro amps. Accordingly, the total power dissipation is in the range of a few microwatts, which compares to a typical power dissipation of a few milliwatts for a typical bipolar reference generator.

Figure 2:
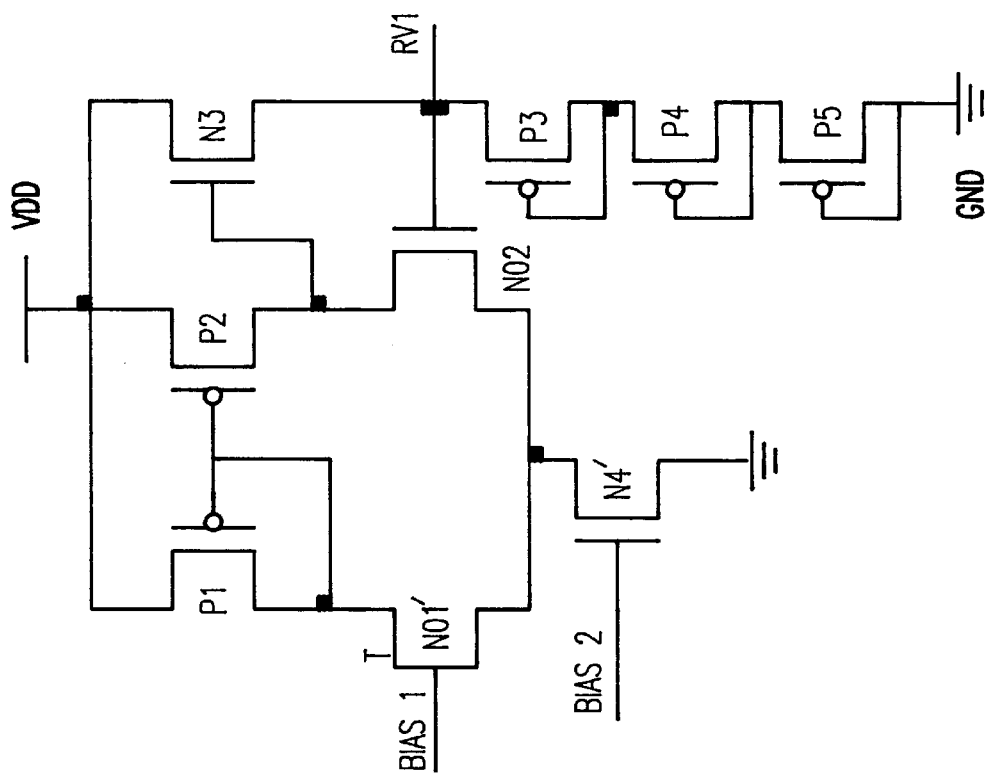
FIG. 2 is a variation of the circuit of FIG. 1 having zero-threshold bias FETs with their respective gates connected to ground.

FIG. 2 shows a further embodiment of the present invention, which is a variation of the embodiment of FIG. 1, using a conventional NFET N01', instead of the zero-threshold NFET N01 and using a conventional NFET N4' instead of the zero-threshold N4. An external voltage source (not shown) inputs BIAS1 voltage to the gate of N01' and another (or identical) external voltage source (not shown) inputs a voltage BIAS2 to the gate of N04'. The voltage levels of BIAS2 is selected for a small bias current through N4', but high enough so the N4' device operates above the subthreshold region, to minimize variations in its bias current which could result from variations in the N4' source-to-drain voltage. BIAS1 is adjusted for a bias current through N01' of one-half the current through N4'.

The benefit of this embodiment is that BIAS2 provides a better control of the N4' bias current, regardless of N4 being a zero threshold or conventional threshold FET device, than is generally available with the gate being tied to a ground.

Note that N4', with BIAS2 could be used while still using the zero-threshold N01 of the FIG. 1 embodiment. Likewise, if desired, the zero-threshold N4 of FIG. 1 could be used with a conventional N01' connected to BIAS1.

Figure 3:
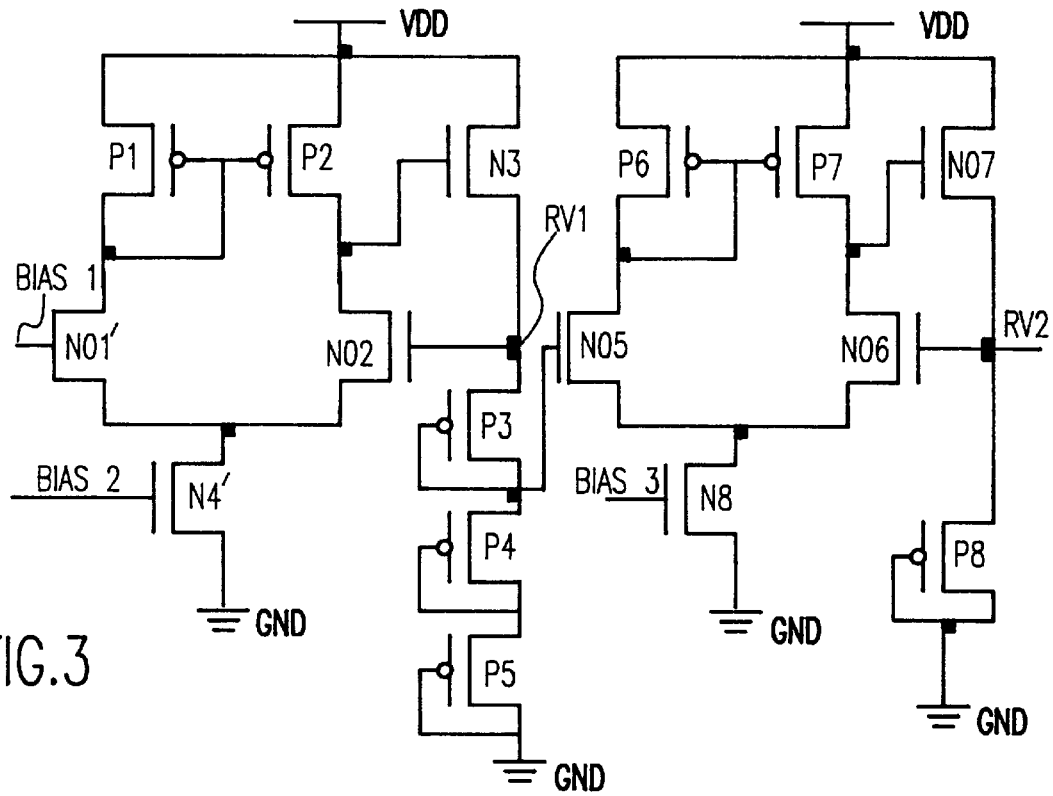
FIG. 3 is a schematic diagram of a two-stage variation of the FIG. 1 embodiment.

FIG. 3 is an example of still another embodiment of the present invention, which uses a multistage arrangement to obtain a reference voltage RV2, which is higher than the N02 1.1V threshold of the FIG. 1 embodiment. The particular example depicted by FIG. 3 implements a 1.8 V reference generator by serially connecting a first and second reference generator, labeled 10 and 20, respectively. The two stage example of this embodiment is required because the difference in the threshold between a p-doped polysilicon gate FET, such as N02, and an n-doped polysilicon gate FET, such as N01, is always approximately 1.1V, as this is the bandgap of, i.e., the difference in the respective Fermi levels of, p-doped and n-doped polysilicon. Accordingly, to attain a reference voltage higher than 1.1V, a threshold of, and a voltage on the gate of N01, must be higher than zero volts.

In view of the above, this example embodiment shown in FIG. 3 is constructed as follows:

The first stage generator 10 is identical to the FIG. 2 embodiment and, accordingly, the item numbers are identical to the item numbers for FIG. 2. The second stage generator is also identical except that N07 is a zero threshold volt device and, for this example, N05 is a 1.1V threshold NFET instead of the zero volt NFET of N01. Otherwise, P6 and P7 are identical to P1 and P2, N06 is identical to N02 and N4 is identical to N8. BIAS3 is from an external bias voltage generator (not shown) and may be identical to BIAS2. Further, the second stage load consisting of a single PFET P8 is only an example load, and multiple FETs or resistors could be used instead. Still further, each of the stages 10 and 20 could be biased by substituting a zero threshold volt NFET (not shown) for each of N4' and N8 and connecting the gate of each to ground.

The operation of the FIG. 3 embodiment is straightforward. Series connected load transistors P3, P4 and P5 serve as a voltage divider. The first stage generator 10 provides a 1.1V output at RV, as described for the FIG. 2 embodiment above. Assuming, for this example, an equal voltage drop across each of P3, P4, and P5, a (⅔)rd fraction of RV of 1.1 V, which is about 0.73 V, is available at the connection (not labeled) between P3 and P4. This 0.73V is input to the second basis generator 10 by the connection (not numbered) to the gate (not numbered) of N05. The current through P6 and P7 is equal, at steady state, because of their having identical respective source-gate voltages. The current through N05 and N06 is therefore equal at steady state.

Because of the 0.73V input to the gate of the zero-threshold N05 the voltage at the gate of N06, which has a 1.1V threshold, must be approximately 1.8 volts for equal current through N05 and N06. The N07 zero threshold NFET device establishes the 1.8V N06 gate voltage on the load P8 using the same feedback operation by which N3 sets the gate voltage of N02 in stage 10, as described in the FIG. 1 and 2 embodiments above. N07, for this example, is a zero threshold voltage NFET device, as compared to the conventional NFET of N3 because the 1.8V on the N07 source (not numbered) would otherwise require a 2.4V or higher voltage on the drain (not numbered) of N06. The example output RV2 of 1.8V corresponds to many applications in 0.25 micron CMOS. Note that the load current through N3 and N07 is very small, in the range, for example, of a few nanoamps.

Figure 4:
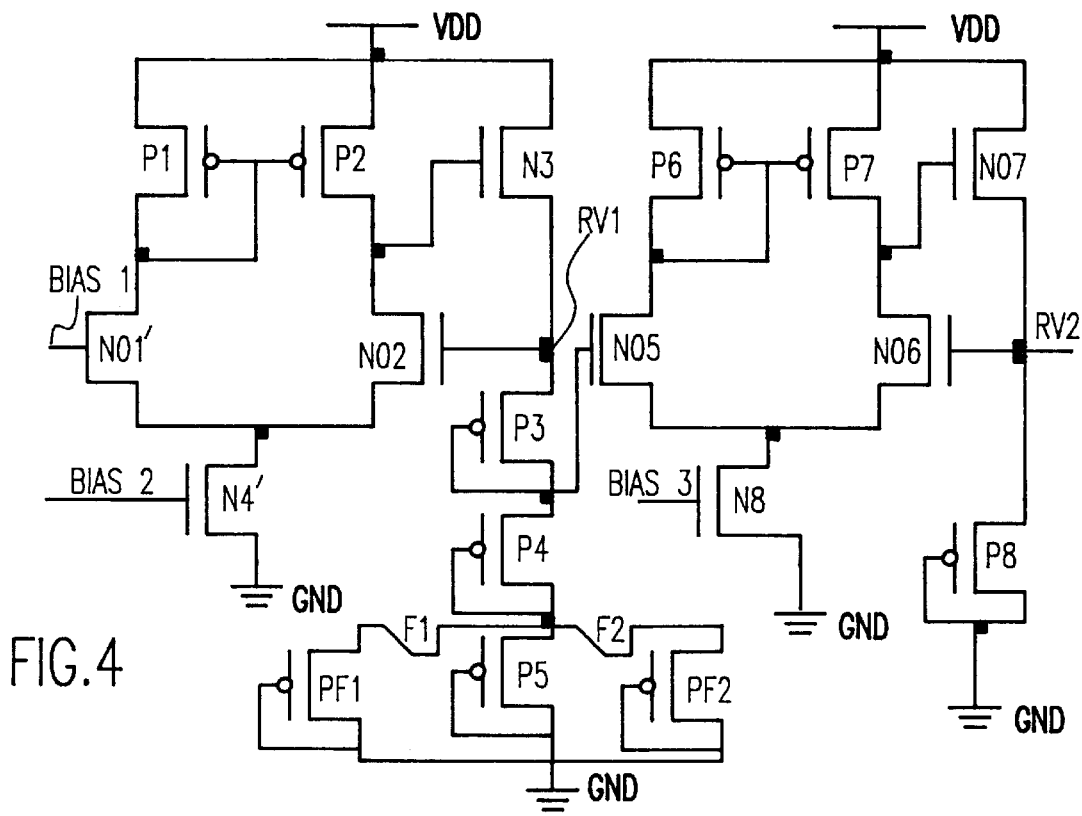
FIG. 4 is a schematic diagram of a further embodiment having fuse-link connected FETs for adjustment of the bias current.

A further embodiment, depicted in FIG. 4, provides for ready trimming to fine tune the output voltage RV2. As shown, PFETs PF1 and PF2 are connected in parallel to P5 by fuses F1 and F2, respectively. By blowing F1 and/or F2, either PF1, PF2, or both may be disconnected, thereby changing the voltage divider parameters set by P3, P4, and P5, and thus adjusting the gate voltage of N05.

Figure 5:
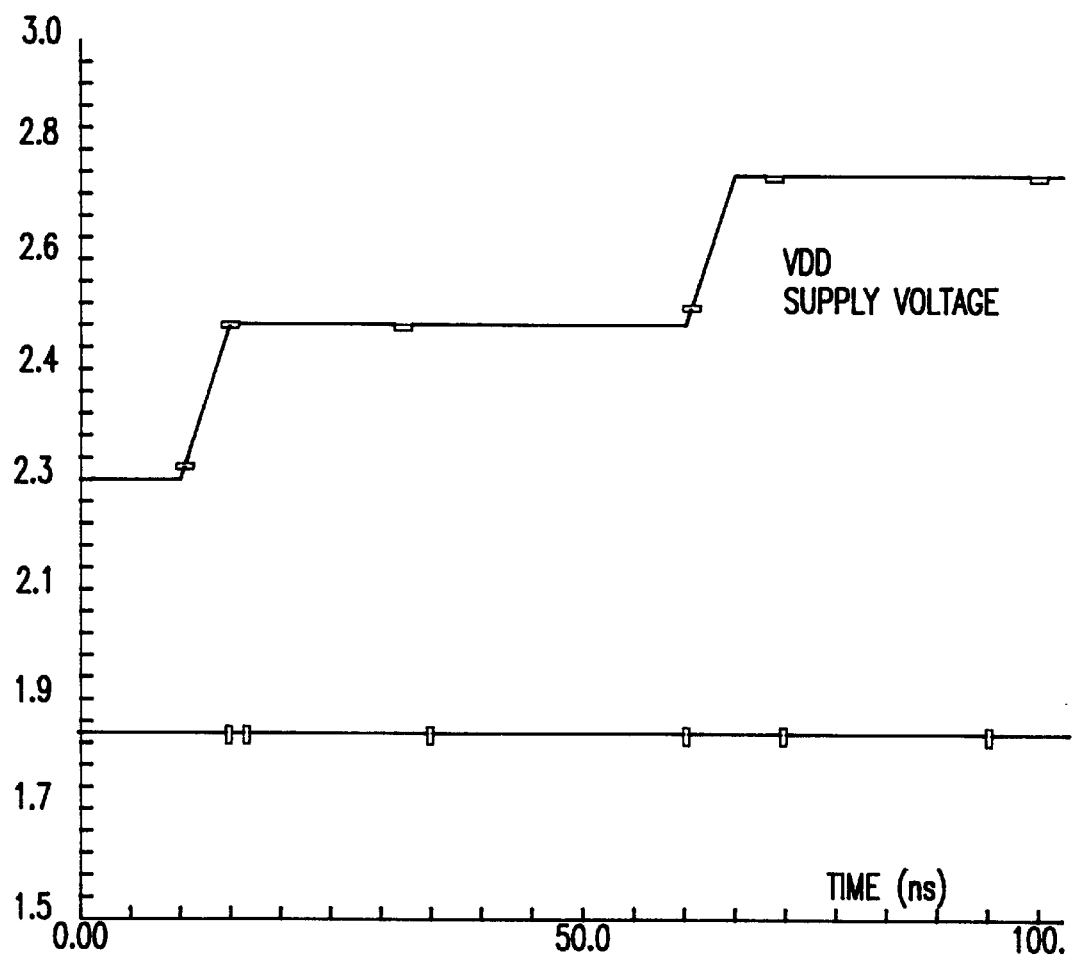
FIG. 5 depicts a computer simulation showing a reference output voltage versus supply voltage for the embodiment of FIG. 2.

Circuits according to the described invention can be readily implemented on bulk or SOI wafers, either 0.25 or 0.15 micron CMOS technology. FIG. 5 shows a computer simulation plot of the FIG. 3 circuit, simulating step increases in the VDD voltage and the corresponding RV2 reference output as a function of time. The simulations show proper operation of the present invention in CMOS technology. More particularly, the reference voltage RV2 is shown independent of the VDD supply voltage over the depicted range. Further simulation shows proper operation of the FIG. 3 circuit when the device parameters are varied within the standard ranges resulting from commercial chip processing.

While the foregoing invention has been described with specific references to examples of its preferred embodiments, it should be understood that various substitutions, variations, and modifications may be made thereto without departing from the scope of the invention as defined in the appended claims. One example variation is a zero threshold PFET device for each of P1 and P2 in FIGS. 1–3 and, further, for P6 and P7 in FIGS. 3 and 4. This substitution could, foreseeably, increase a range of VDD over which RV1 and RV2 would be constant. Another example variation is to substitute a mirrored-parameter equivalent PFET for each NFET, and an equivalent NFET for each PFET, in any of the depicted embodiments and reverse VDD and ground. These and other variations of the present claimed invention will, in view of the above specification and referenced drawings, be readily apparent to one of ordinary skill.

Having thus described my invention, what we claim as new and desire to secure by Letters Patent is as follows:

1. A reference generating circuit comprising:
   a load element connected between a terminal for receiving a first external power supply voltage and an output reference terminal;
   means for supplying a current through said load element, including means for receiving a second external power supply voltage and for receiving a load current control voltage, and means for supplying the current through said load element in response to the received second power supply voltage and in accordance with the received load current control voltage;
   a differential amplifier having a first branch, a second branch, and a common current branch, said first branch and said second branch connected in parallel between a terminal for receiving the second external voltage and a first end of the common current branch,
   said first branch including a first current control element connected in series with a second current control element, each having a current input, a current output and a control terminal, and each having means for controlling the current between its current input and current output according to a voltage received at its respective control terminal, the means for controlling the current between the current input and current output of the second current control element passing a predetermined current through the second current control element when its control terminal receives a voltage equal to a first bias voltage,
   said second branch including means for detecting a current passing through said second branch and for outputting, based on said detected current, the load current control voltage to the means for supplying a current through said load element, and including a third current control element and a fourth current control element, each having a current input and a current output and a control terminal, and each having means for controlling the current between its respective input and output according to a voltage received at its respective control terminal, wherein the means for controlling the current between the current input and output of the fourth current control element passes approximately said predetermined current through the fourth current control element when the voltage on its control terminal is above a first threshold voltage of the fourth current control element, and the common current branch includes a second bias control terminal for receiving a second bias voltage and includes a bias means for controlling a current from the first end of the common current branch to a terminal for receiving the first external voltage in accordance with the received second bias voltage, and wherein the control terminal of the first current control element is connected to the control terminal of the third current control element, the reference terminal of the load element is connected to the control terminal of the fourth current control element, whereby upon concurrently receiving the first predetermined bias voltage at the control terminal of the second current control element, the second predetermined bias voltage at the second bias control terminal, and a predetermined range of first and second external power supply voltages, the reference output terminal output is driven to approximately the first threshold voltage of the fourth current control element.

2. A reference generator circuit according to claim 1 wherein the second current control element passes said predetermined current in response to receiving a first bias voltage equal to the first external power supply voltage.

3. A reference generator circuit according to claim 1 wherein the bias means passes approximately twice said predetermined current in response to receiving at the second bias control terminal a second bias voltage equal to the first external power supply voltage.

4. A reference circuit according to claim 1 further comprising means for receiving a voltage on said reference output terminal and for generating and outputting an intermediate voltage proportional to said received voltage;

a second reference generating circuit comprising:

a second load element connected between a terminal for receiving a first external power supply voltage and a second reference output terminal, means for supplying a current through said second load element, including means for receiving the second external power supply voltage and means for receiving a second load current control voltage and means for supplying the current through said second load element in response to receiving the second power supply voltage and in accordance with the second load current control voltage;

a second differential amplifier having a third branch, a fourth branch, and a second common current branch, said third branch and said fourth branch connected in parallel between a terminal for receiving the second external voltage and a first end of the second common current branch, said third branch including a fifth current control element connected in series with a sixth current control element, each having a current input, a current output and a control terminal, and each having means for controlling the current between its current input and current output according to a voltage received at its respective control terminal, the means for controlling the current between the current input and current output of the sixth current control element passing a second predetermined current through the sixth current control element when its control terminal receives a voltage equal to a predetermined value of said intermediate voltage, said fourth branch including means for detecting a current passing through said fourth branch and for outputting, based on said detected current, the second load current control voltage, and including an seventh current control element and an eighth current control element, each having a current input and a current output and a control terminal, and each having means for controlling the current between its respective input and output according to a voltage received at its respective control terminal, wherein the means for controlling the current between the input and output of the eighth current control element passes approximately said second predetermined current through the eighth current control element when the voltage on its control terminal is above a second threshold voltage, and the second common current branch includes a third bias control terminal for receiving a third bias voltage and includes means for controlling a current from the first end of the second common current branch to a terminal for receiving the first external voltage in accordance with the received third bias voltage, and wherein the control terminal of the fifth current control element is connected to the control terminal of the sixth current control element, and the second reference output terminal is connected to the control terminal of the eighth current control element, whereby upon concurrently receiving the intermediate voltage at the control terminal of the sixth current control element and the third predetermined bias voltage at the second control terminal of the second common current branch and a predetermined range of first and second external power supply voltages, the second reference output terminal output voltage is approximately the sum of the intermediate voltage and the second threshold voltage.

5. A reference circuit according to claim 1 further comprising a bias conductor;

a link formed of readily meltable fuse metal for connecting said bias conductor parallel with said load element.

6. A reference voltage generating circuit comprising a first branch comprising a first field effect transistor connected in series with a second field effect transistor, said second field effect transistor having a first threshold voltage, wherein the source of said first field effect transistor has a terminal for receiving a first external voltage, the drain of said first field effect transistor is connected to the drain of said second field effect transistor, the gate of said first field effect transistor is connected to the drain thereof, and the gate of said second field effect transistor has a terminal for receiving a first bias voltage;

a second branch comprising a third field effect transistor connected in series with a fourth field effect transistor, said fourth field effect transistor having a second threshold voltage, wherein the source of said third field effect transistor has a terminal for receiving said first external voltage, the drain of said third field effect transistor is connected to the drain of said fourth field effect transistor, the gate of said third field effect transistor is connected to the gate of said first field effect transistor, and a reference voltage output terminal is connected to the gate of said fourth field effect transistor;

a common branch comprising a fifth field effect transistor having its drain connected to the source of the second field effect transistor and to the source of fourth field effect transistor, its source having a terminal for receiving the second external voltage, and having its gate connected to a second bias voltage; and a load branch comprising a sixth field effect transistor connected in series with a load element having a first current terminal and a second current terminal, wherein the drain of said sixth field effect transistor has a terminal for receiving the first external voltage, the gate of the sixth field effect transistor is connected to the drain of said fourth field effect transistor, and the source of the sixth field effect transistor is connected to said first current terminal of the load branch and to the gate of said fourth field effect transistor, and wherein said first and second threshold voltages have a value relative to one another and relative to the first bias voltage such that a difference between the first and second external voltage above a predetermined value will cause a voltage on the gate of said fourth field effect transistor, and thereby on said reference voltage output terminal, approximately equal to a sum of said first bias voltage and said second threshold voltage corresponding to an approximately equal current through said first and second branch.

7. A reference voltage generating circuit according to claim 6 wherein said predetermined value is the value at which the first and third field effect transistors are in saturation.

8. A reference voltage generating circuit according to claim 6 wherein said first threshold value is equal to approximately zero volts.

9. A reference voltage generating circuit according to claim 6 wherein said load element includes a voltage divider having a divider terminal for outputting a voltage having an absolute value less than the difference between said reference voltage and the second external voltage.

10. A reference voltage generating circuit according to claim 9 further comprising a second reference generating circuit, said second reference generating circuit comprising:

a third branch comprising a seventh field effect transistor connected in series with an eighth field effect transistor, said eighth field effect transistor having a third threshold voltage, wherein the source of said seventh field effect transistor has a terminal for receiving a first external voltage, the drain of said seventh field effect transistor is connected to the drain of said eighth field effect transistor, the gate of said seventh field effect transistor is connected to the drain thereof, and the gate of said eighth field effect transistor is connected to said divider output terminal;

a fourth branch comprising an ninth field effect transistor connected in series with a tenth field effect transistor, said tenth field effect transistor having a fourth threshold voltage, wherein the source of said ninth field effect transistor has a terminal for receiving the first external voltage, the drain of said ninth field effect transistor is connected to the drain of said tenth field effect transistor, the gate of said ninth field effect transistor is connected to the gate of said seventh field effect transistor, and a second reference voltage output terminal is connected to the gate of said tenth field effect transistor;

a common branch comprising an eleventh field effect transistor having its drain connected to the source of the eighth field effect transistor and to the source of said tenth field effect transistor, the source of the eleventh field effect transistor having a terminal for receiving the second external voltage, and the gate of the eleventh field effect transistor being connected to a third bias voltage; and a second load branch comprising twelfth field effect transistor connected in series with a second load element having a first current terminal and a second current terminal, wherein the drain of said twelfth field effect transistor has a terminal for receiving the first external voltage, the gate of the twelfth field effect transistor is connected to the drain of said tenth field effect transistor, and the source of the twelfth field effect transistor is connected to the first current terminal of the second load element and to the gate of said tenth field effect transistor, and wherein said third and fourth predetermined threshold voltages have a value relative to one another such that a difference between the first and second external voltage above a predetermined value will cause a voltage on the gate of said tenth field effect transistor, and thereby on said second reference voltage output terminal, approximately equal to a sum of said divider output voltage and said third and fourth threshold value.

11. A reference voltage generating circuit according to claim 6 wherein said second field effect transistor and said fourth field effect transistor have a difference between their respective first and second threshold voltage that is equal to the fundamental bandgap value of the gate material with which said transistors are formed.

12. A reference voltage generating circuit according to claim 11 wherein said gate material is a silicon material.

13. A reference circuit according to claim 6 wherein said second field effect transistor is an NFET having an n-polysilicon gate material and said fourth field effect transistor is an NFET having an NFET having a p-polysilicon gate material.

* * * * *